(12) United States Patent
Moran et al.

(10) Patent No.: US 8,501,612 B2
(45) Date of Patent: Aug. 6, 2013

(54) FLIP CHIP STRUCTURE AND METHOD OF MANUFACTURE

(75) Inventors: John D. Moran, Mesa, AZ (US); Blanca Kruse, Maricopa, AZ (US); Amilcar B. Gamez Sanchez, Chandler, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 1219 days.

(21) Appl. No.: 11/858,289

(22) Filed: Sep. 20, 2007

(65) Prior Publication Data
US 2009/0079093 A1    Mar. 26, 2009

(51) Int. Cl.
*H01L 21/44* (2006.01)

(52) U.S. Cl.
USPC .......................................... 438/612; 257/690

(58) Field of Classification Search
USPC ........................................ 438/613, 612, 614
See application file for complete search history.

(56) References Cited

U.S. PATENT DOCUMENTS

| | | | |
|---|---|---|---|
| 4,732,838 A | 3/1988 | Sechi et al. | |
| 5,196,371 A | 3/1993 | Kulesza et al. | |
| 5,492,863 A | 2/1996 | Higgins, III | |
| 5,508,228 A * | 4/1996 | Nolan et al. | 438/614 |
| 5,656,547 A * | 8/1997 | Richards et al. | 438/460 |
| 5,907,785 A * | 5/1999 | Palagonia | 438/613 |
| 6,189,208 B1 | 2/2001 | Estes et al. | |
| 6,221,751 B1 * | 4/2001 | Chen et al. | 438/612 |
| 6,617,702 B2 * | 9/2003 | Hsu et al. | 257/797 |
| 6,897,568 B2 * | 5/2005 | Haimerl et al. | 257/779 |
| 6,930,032 B2 * | 8/2005 | Sarihan et al. | 438/614 |
| 7,060,601 B2 * | 6/2006 | Savastiouk et al. | 438/584 |
| 2006/0060983 A1 * | 3/2006 | Saito | 257/780 |
| 2006/0177969 A1 * | 8/2006 | Dotsikas | 438/117 |

OTHER PUBLICATIONS

FlipChip International, Bumping Design Guide, FlipChip International LLC, 2007, Revised: May, 2007, www.flipchip.com.

* cited by examiner

*Primary Examiner* — Jenny L Wagner
*Assistant Examiner* — Mark Tornow
(74) *Attorney, Agent, or Firm* — Kevin B. Jackson

(57) ABSTRACT

A flip chip structure includes glass stand-offs formed overlying a substrate surface. A conductive layer is formed overlying the glass stand-offs and configured for attaching to a next level of assembly. In one embodiment, photo glass processing is used to form the glass stand-offs.

20 Claims, 3 Drawing Sheets

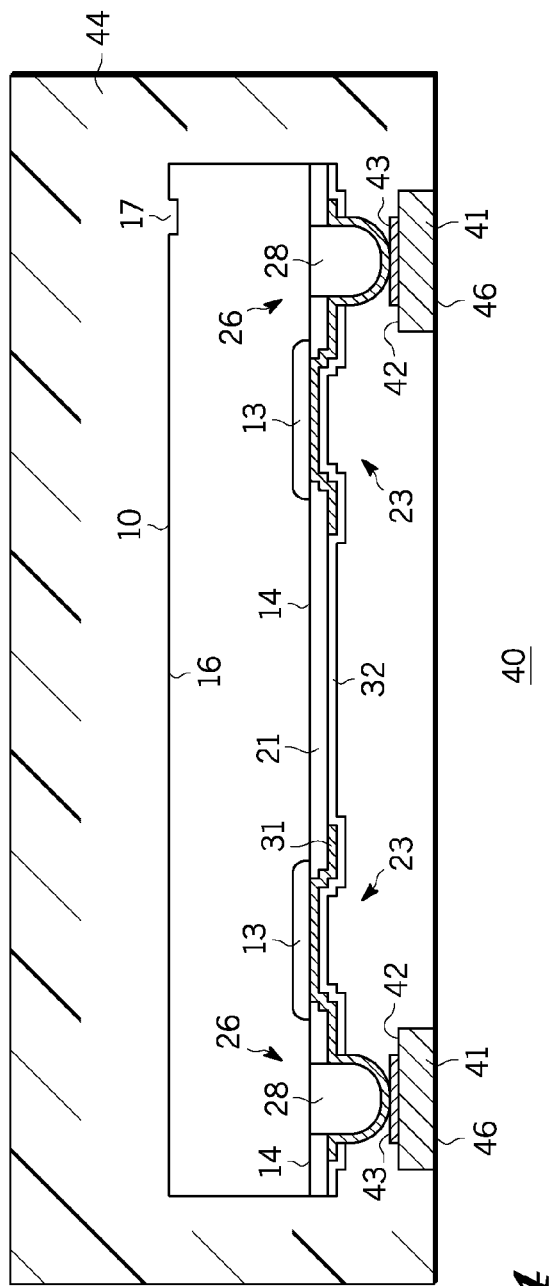
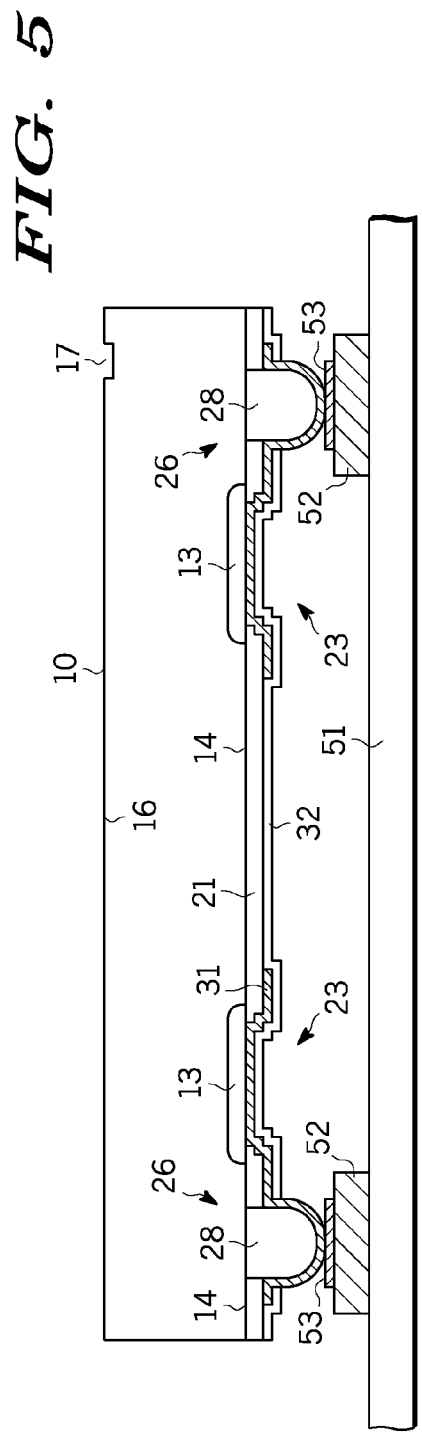

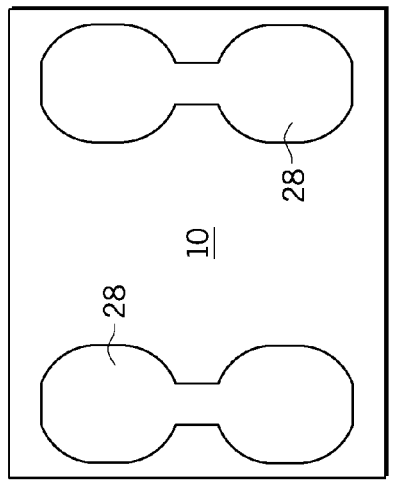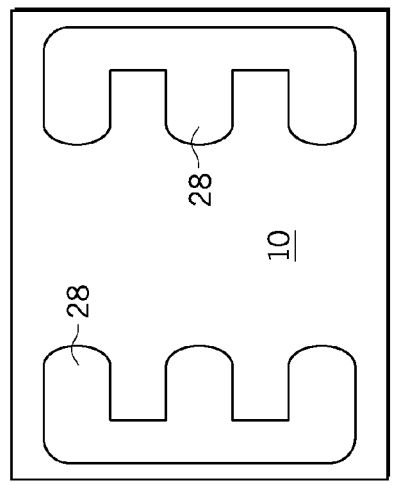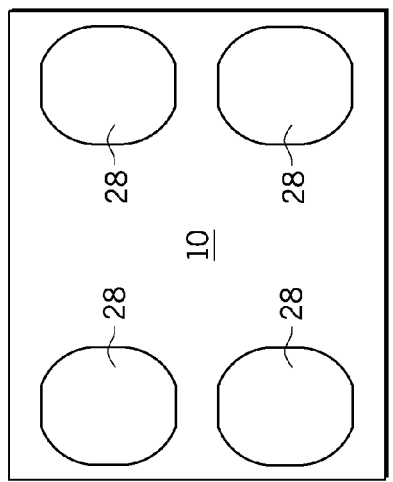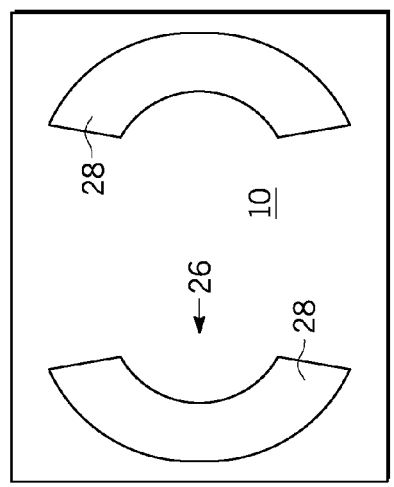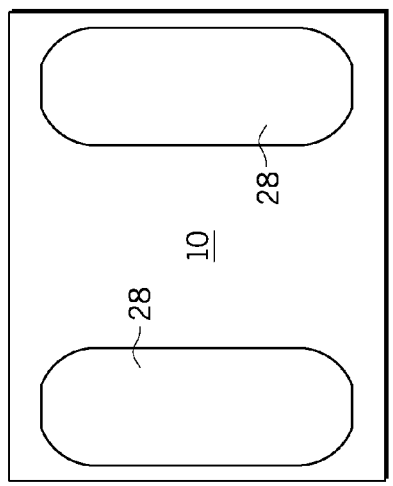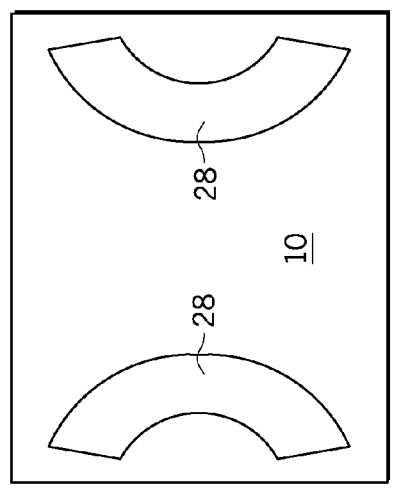

FLIP CHIP STRUCTURE AND METHOD OF MANUFACTURE

FIELD OF THE INVENTION

This invention relates generally to electronic devices, and more specifically to electronic packages and methods of manufacture.

BACKGROUND OF THE INVENTION

Flip chip microelectronic assembly is the direct electrical connection of face-down (hence, "flipped") electronic components onto substrates, circuit boards, or carriers, using conductive bumps formed on chip or die bond pads. In contrast, wire bonding, a conventional technology, uses face-up chips with a wire connection to each chip bond pad. Flip chip packaging has several advantages over conventional packages including size, performance, flexibility, reliability, and cost.

Typically, flip chip components are semiconductor devices, but manufacturers use the technology as well with components such as passive filters, detector arrays, and sensor devices. Flip chip is also referred to Direct Chip Attach (DCA), a more descriptive term, because the chip is directly attached to the substrate, board, or carrier by the conductive bumps.

In flip chip devices, the conductive bumps serve several functions. Electrically, the bumps provide the conductive path from the chip to the substrate. Thermally, the bumps provide a heat conductive path to carry heat away from the chip to the substrate. Mechanically, the bumps become part of the physical mount between the chip and the substrate. Further, the bumps provide a spacer or stand-off feature that prevents electrical contact between the chip and substrate conductors.

There are three general stages in manufacturing flip chip devices. These include bumping the chip or wafer, attaching the bumped chip to the board or substrate, and in most cases, filling the remaining space under the chip with an electrically non-conductive material. The present invention pertains to the first general stage of bumping.

Prior art methods of forming flip chip bumps include solder bumping, plated bumping, stud bumping, and adhesive bumping. A solder bumping process first requires that an under bump metallization (UBM) be placed onto the bond pads by sputtering, plating, or other means. Conductive solder bumps are then deposited over the UBM by evaporation, electroplating, screen printing solder paste, or needle-depositing.

In plated bump technology, wet chemical processes are used to remove native oxide films and to plate conductive metal bumps onto the bond pads. For example, plated nickel-gold bumps are formed by electroless nickel plating of bond pads, which comprise, for example, aluminum. After plating a desired thickness of nickel, an immersion gold layer is added for protection.

In the stud bump process, a modified standard wire bonding technique is used with gold wire being typical. This technique makes a gold ball for wire bonding by melting the end of a gold wire to form a sphere. The gold ball is attached to the chip bond pad as the first part of a wire bond. To form gold bumps instead of wire bonds, wire bonders are modified to break off the wire after attaching the ball to the chip bond pad.

In the adhesive bump flip chip process, stencils are used to form conductive adhesive bumps on UBM layers overlying chip bond pads. The cured adhesive acts as conductive bumps. An additional layer of conductive adhesive is used to attach the chip to a next level of assembly.

As is apparent from the above description, the various prior art methods for forming flip chip conductive bumps involve extensive processing steps and added materials that are expensive. Also, these processes involve additional or complex wafer handling steps that can cause wafer breakage and/or damage, which in turn, detrimentally impacts yield and device performance. Moreover, many of the fabrication steps used in the prior art processes use environmentally restrictive and harmful chemicals.

Accordingly, a need exists for a cost effective and reliable bump structure and method of manufacture that overcome the issues of the prior art including those noted above.

BRIEF DESCRIPTION OF THE DRAWINGS

FIG. 4 illustrates a cross-sectional view of a electronic package including the flip chip structure of FIG. 1;

FIG. 5 illustrates a cross-sectional view of the flip chip structure of FIG. 1 attached to a next level of assembly; and FIGS. 6-11 illustrate top views of various bump shape embodiments in accordance with the present invention.

DETAILED DESCRIPTION OF THE DRAWINGS

Figure 1:
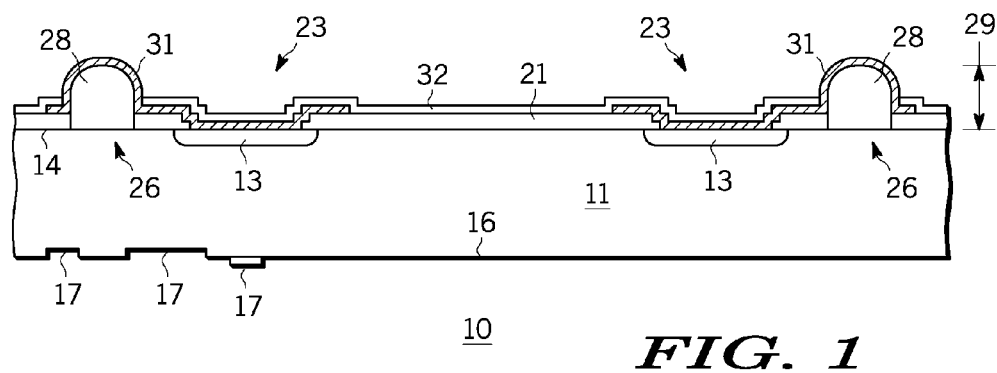
FIG. 1 illustrates a cross-sectional view of a flip chip structure in accordance with the present invention.

For ease of understanding, elements in the drawing figures are not necessarily drawn to scale, and like element numbers are used where appropriate throughout the various figures to denote the same or similar elements. Also, although the present invention is described hereinafter in a semiconductor diode configuration, it is understood that the present invention is suitable for other electronic devices including passive components, filters, detector arrays, sensor components, integrated circuit components, or the like, or any structure compatible with flip chip attach assembly techniques.

FIG. 1 shows a cross-sectional view of a flip chip device, direct chip attach device, electronic device, or semiconductor device 10 in accordance with one embodiment of the present invention. In this embodiment, device 10 comprises a bidirectional transient voltage suppression (TVS) diode. Device 10 includes a semiconductor substrate 11 of a first conductivity type (e.g., n-type), and a pair of spaced apart doped regions 13 of a second conductivity type (e.g., p-type) opposite to the first conductivity type. In one embodiment, substrate 11 comprises a suitable semiconductor material such as silicon, a III-V material, a IV-IV material, or the like. Substrate 11 further includes two opposing major surfaces 14 and 16 with doped regions 13 extending from surface 14 as shown in FIG. 1. Surface 16 is shown with alignment structures 17, which are used in one method for forming features of device 10 in accordance with the present invention. This will be explained in more detail below. It is understood that in other embodiments, substrate 11 comprises a ceramic material or other material configured for a flip chip application.

Device 10 further includes a passivation layer 21 formed overlying surface 14, and is patterned to form windows or openings 23 above or over doped regions 13. Windows 23 provide access through passivation layer 21 to doped regions 13 for contact structures. In one embodiment, passivation layer 21 comprises thermal oxide. It is understood that passivation layer 21 may comprise several layers of passivation formed at different times. For example, an initial passivation is formed and patterned with the pattern then used to form doped regions 13. Additional passivation layers may be added for example, when doped regions 13 are formed during a high temperature diffusion step after dopant is introduced into substrate 11. In this embodiment, device 10 further includes windows or openings 26 formed in passivation layer 21 to expose portions of substrate 11. In this embodiment, openings 26 are off-set or spaced apart from the active devices (e.g., doped region 13). That is, they do not directly overlie the active devices.

In accordance with the present invention, glass, passivation glass, offset glass, or patterned glass bumps, mounds, or stand-offs 28 are formed overlying substrate 11 and within windows 26. Glass bumps 28 comprise, for example, silica fused with a basic oxide. In contrast to prior art or conventional flip chip bumps, stand-offs or bumps 28 are not electrically conductive. In one embodiment glass bumps 28 are formed using a glass further treated with a light sensitive component such as a photoresist. Such glasses are referred to as "photo glasses".

Photo glasses are formed by mixing commercially available powder glasses such as GP220 powder passivation glass with a conventional liquid photoresist. GP220 powder glass is available from Nippon Electric Glass Co. Ltd of Shiga, Japan. In one embodiment, the photo glass mixture is produced by combining the powdered glass, a negative photo resist, and a solvent (e.g., Xylene). The combined ingredients for the photo glass are then blended to form a homogeneous mix. The homogeneous mix is then dispensed onto the substrate as further described below. A more detailed description of photo glass compositions is provided in U.S. Pat. No. 4,732,838 by Franco N. Sechi et al. issued on Mar. 22, 1988, which is hereby incorporated by reference. In semiconductor processing, photo glasses are conventionally used to passivate pn junctions in very high voltage (>250 volts) rectifier, thyristor, and bipolar transistor devices. Such devices are packaged using conventional face-up packaging techniques.

Glass bumps 28 are configured in the present invention to provide a stand-off or physical separation feature so that device 10 is suitable for flip chip mounting. Since bumps 28 comprise glass, bumps 28 have a thermal expansion coefficient that more closely matches that of substrate 11, which thereby reduces stresses in device 10 particularly when device 10 is attached to a next level of assembly. In this embodiment, windows 26 expose portions of substrate 11 to provide wettable surfaces for glass bumps 28 to form when liquid glass materials are used. In one embodiment, windows 26 are 0.140 millimeters (mm) by 0.240 mm.

The following description provides an example of a suitable process flow for forming glass bumps 28 using photo glass. Once windows 26 are formed, a layer photo glass is deposited using, for example, spin coating techniques. In accordance with this embodiment, glass bumps 28 have a target height 29 from about 0.020 mm to about 0.040 mm. To support this target thickness range, a photo glass layer from about 0.020 mm to about 0.060 mm is deposited during the spin process. The photo glass layer is then subjected to a soft bake process (e.g., 15-45 minutes at 80-90 degrees Celsius in a nitrogen ambient), and then patterned using a desired photo mask pattern.

Since it is difficult to align a photo mask directly through a photo glass layer, alignment features 17 on major surface 16 together with a double sided photo-alignment tool are used to pattern the photo glass layer. By way of example, a Karl Suss double-sided photo-alignment tool is suitable for this fabrication step. By way of example, alignment features or marks 17 are formed in an earlier fabrication step on surface 16, and are then used to align a suitable photo mask for patterning the photo glass material on opposite surface 14. In one embodiment, substrate 11 is thinned using lapping or grinding techniques to a desired final thickness early in the fabrication process before marks 17 are formed on surface 16. This way marks 17 remain on device 10 when finished, and marks 17 may comprise information useful for identification.

As a next step, the patterned photo glass is subjected to another soft bake process, and then developed. Next, the developed photo glass layer is subjected to a hard bake step (e.g., 15-45 minutes at 120-160 degrees Celsius) and cleaned using, for example, an 11:1 HF etchant. Finally, the photo glass is subjected to a multiple step fire process (e.g., pre-fire step—about 35 Minutes at 400-530 degrees Celsius in an oxygen ambient; fire step—about 30 minutes at 700-830 degrees Celsius in an nitrogen/oxygen ambient) to form glass bumps 28. For glass bumps 28 having a greater thickness, thicker or multiple coatings of photo glass layers are used.

Device 10 further includes a conductive layer or layers 31 formed overlying glass bumps 28, which in this embodiment are further coupled to doped regions 13 to provide an electrically conductive path. By way of example, conductive layers 31 comprise a first layer of aluminum about 0.002 mm to about 0.004 mm thick, with a solder compatible metal formed overlying the aluminum layer. The first layer (e.g., aluminum) functions as a stress relief or buffer layer to reduce stresses when device 10 is attached to a next level of assembly.

Solderable metals such a titanium/nickel/silver laminates or chromium/nickel/gold laminate are suitable as second layers overlying stress relief layer. The second or solder compatible layer may overlie all of the aluminum layer or just that portion overlying glass bumps 28 or less (i.e., in an amount sufficient for form a bond to a next level of assembly when solderable materials are used).

In an optional embodiment, a passivating layer 32 is then formed overlying portions of device 10 while leaving portions of conductive layer 31 exposed overlying glass bumps 28. By way of example, passivating layer 32 comprises a low temperature oxide or the like.

Figure 2:
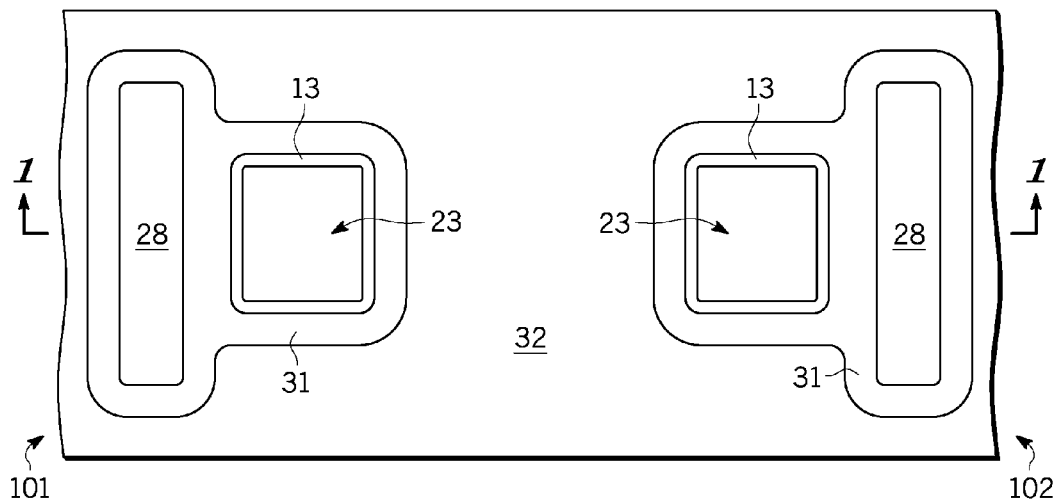
FIG. 2 illustrates a top view of the structure of FIG. 1.

FIG. 2 shows a top view of device 10. The reference line 1-1 shows where the cross-section of FIG. 1 is applied. In this embodiment, glass mounds 28 comprise elongated rectangular like or stripe shapes formed in proximity to two opposing outer edges 101 and 102 of device 10.

Figure 3:
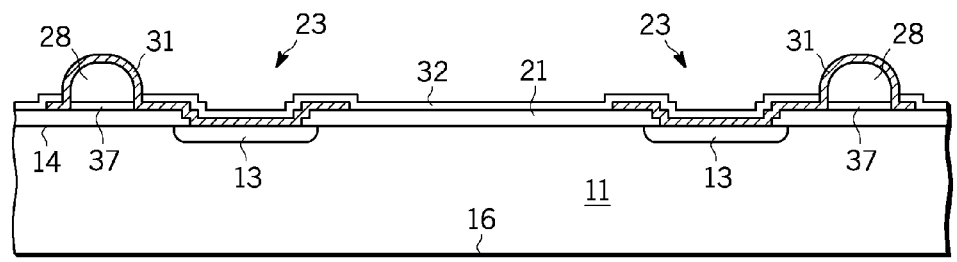
FIG. 3 illustrates a cross-sectional view of another flip chip structure in accordance with the present invention.

FIG. 3 shows a cross-sectional view of a flip chip device, direct chip attach device, electronic device, or semiconductor device 30 in accordance with another embodiment of the present invention. Device 30 is similar to device 10 except that device 30 includes wettable, buffer, or adhesion layers or pads 37 formed and patterned overlying passivation layer 21 or substrate 11. In this embodiment, windows 26 as shown in FIG. 1 are not required with layers 37 instead providing a wettable surface for the formation of glass bumps 28. By way of example, layers 37 comprise a polycrystalline semiconductor material or an amorphous semiconductor material. In one embodiment, layers 37 comprise polysilicon. Glass bumps 28 typically will be larger than the initially patterned photo glass material, and may be larger than the pads 37 since the glass flows during glass fire. Alternatively, dimensions (length and width) may be smaller than those of pads 37.

FIG. 4 shows a cross-sectional view of a packaged structure 40 including as an example, flip chip device 10 in accordance with the present invention. Structure 40 includes a conductive lead frame structure 41 having bonding surfaces 42 for receiving device 10. Solder layers 43 attach conductive layers 31 overlying glass bumps 28 to bonding surfaces 42.

Solder layers 43 comprise metal solders such as lead/tin or epoxy solder materials. As shown, glass bumps 28 are configured as stand-offs providing mechanical separation and electrical isolation of device 10 from lead frame 41 except where conductive layers 31 contact desired bonding surfaces 42. Package structure 40 further includes a molded encapsulating layer 44 that passivates and protects device 10 while leaving portions 46 of lead frame 41 exposed for attachment to a next level of assembly such as a printed circuit board.

FIG. 5 shows a cross-sectional view of flip chip device 10 attached directly to a next level of assembly 51 such as a printed circuit board. PC board 51 is shown with bonding pads 52 that are configured for receiving device 10. Solder layers 53 attach conductive layers 31 overlying glass bumps 28 to bonding pads 52. Solder layers 53 comprise metal solders such as lead/tin or epoxy solder materials. As shown, glass bumps 28 are configured as stand-offs providing mechanical separation and electrical isolation of device 10 from next level of assembly 51 except where conductive layers 31 contact desired bonding pads 52.

In general, glass bumps 28 comprise shapes that are optimized to reduce stress, provide sufficient mechanical separation in conjunction with a next level of assembly, and further provide features such as control over solder flow when attaching the flip chip structure to a next level of assembly.

FIGS. 6-11 show top views of various embodiments or shapes for glass bumps 28 in accordance with the present invention. These embodiments are formed using photo glass processing as described above further using appropriately configured photo masks. Although these examples are shown with windows 26 from FIG. 1, it is understood that windows 26 may be replaced with pads 37 as shown in FIG. 3. As shown in these examples, glass bumps 28 may comprise elongated stripe or rectangular like shapes with rounded ends (FIG. 6); a plurality of circular like shapes (FIG. 7); dumbbell like shapes (FIG. 8); arc like shapes (FIGS. 9 and 10); and "E" like shapes.

Glass bumps 28 provide several advantages over conventional bump processes used in the prior art. For example, glass bumps 28 are formed during front end wafer processing steps thus eliminating the need for expensive and external back end bump processing steps. Glass bumps 28 enable accurate bumps placement and sizing to accommodate a variety of chip or package requirements. Additionally, fewer process steps are required to form glass bumps 28 and fewer environmentally restrictive materials are necessary. Further, glass bumps 28 are less susceptible to mechanical stress issues compared to prior art bump structures.

Thus, it is apparent that there has been provided, in accordance with the present invention, a flip chip structure and method of manufacture that utilizes glass stand-offs or bumps. In one embodiment, photo glass processing techniques are used to form the glass bumps.

Although the invention has been described and illustrated with reference to specific embodiments thereof, it is not intended that the invention be limited to these illustrative embodiments. For example, trench alignment features formed on first major surface 14 may be used to align the photo-glass layer. Such trench alignment features are about 10 to about 20 microns deep when the photo-glass layer is on the order of 20 microns thick.

What is claimed is:

1. A method for forming an electronic device for flip chip mounting comprising the steps of:
providing a substrate having first and second opposed major surfaces, wherein the substrate includes an electronic device formed in the substrate adjacent to the first major surface;
forming a glass bump on the first major surface, wherein the glass bump is configured for mounting the substrate in a flip chip configuration;
forming a first conductive layer overlying the glass bump, wherein the first conductive layer is configured for attaching to a next level of assembly; and
forming an insulating layer overlying portions of the substrate in spaced relationship to the first major surface and an outer surface of the first conductive layer while leaving other portions of the first conductive layer exposed for attaching to the next level of assembly.

2. The method of claim 1, wherein the step of forming the glass bump including forming the glass bump with photo glass.

3. The method of claim 2, further comprising the steps of: forming an alignment feature on the second major surface before the step of forming the glass bump; and using the alignment feature while forming the glass bump.

4. The method of claim 1, further comprising the step of forming a wettable surface in spaced relationship with substrate before the step of forming glass bump, and wherein the step of forming the glass bump includes forming the glass bump on the wettable surface.

5. The method of claim 4, wherein the step of forming the wettable surface includes forming a polysilicon pad overlying the first major surface.

6. The method of claim 4, wherein the step of forming the wettable surface including exposing a portion of the substrate through a passivation layer.

7. The method of claim 1, further comprising the step of:
forming a stress relief layer between at least a portion of the glass bump and at least a portion of the first conductive layer.

8. A process for forming a flip chip structure comprising the steps of:
providing a substrate having first and second opposed major surfaces, wherein the substrate includes an electronic device formed in the substrate adjacent to the first major surface;
forming an alignment feature on the second major surface;
forming wettable regions in spaced relationship to the first major surface;
forming a layer of photo glass on the first major surface;
patterning the layer of photo glass to form glass bumps in spaced relationship to the wettable regions overlying the first major surface while using the alignment feature in spaced relationship to the second major surface, wherein the glass bumps are configured for flip chip mounting of the structure; and
forming a conductive layer overlying at least a portion of at least one glass bump and further electrically coupled to an active device.

9. The process of claim 8, further comprising the step of forming an insulating layer overlying portions of substrate in spaced relationship to the first major surface and an outer surface of the conductive layer while leaving other portions of the conductive layer overlying the at least one glass bump exposed.

10. The process of claim 8, further comprising the step of forming identification marks on the second major surface.

11. The method of claim 8, wherein the step of forming the conductive layer includes the steps of:
forming a conductive stress relief layer; and forming a solder compatible layer overlying at least a portion of the conductive stress relief layer.

12. The process of claim 8, further comprising the steps of:
attaching the conductive layer to a next level of assembly; and
encapsulating at least a portion of the structure.

13. The process of claim 8, wherein the step of patterning comprises patterning the layer of photo glass to form a glass bump having an arc like shape.

14. The process of claim 8, wherein the step of patterning comprises patterning the layer of photo glass to form a glass bump having an elongated stripe shape.

15. The process of claim 8, wherein the step of patterning comprises patterning the layer of photo glass to form a glass bump having a dumb bell shape.

16. A method for forming an electronic device comprising the steps of:
providing a substrate having first and second opposed major surfaces;
forming a first active device in the substrate adjacent to first major surface;
forming an alignment feature on the second major surface;
forming a wettable region in spaced relationship to the first major surface, wherein the wettable region and the first active device are off-set from each other;
forming a layer of photo glass on the first major surface;
using the alignment feature to pattern the layer of photo glass to form a glass bump in spaced relationship to the wettable region, wherein the glass bump is configured for flip chip mounting of the electronic device; and
forming a conductive layer overlying at least a portion of the glass bump and further electrically coupled to the first active device.

17. The method of claim 16, wherein the step of providing the substrate includes providing a substrate comprising a semiconductor material.

18. The method of claim 16 further comprising the step of forming an insulating layer overlying portions of substrate in spaced relationship to the first major surface and an outer surface of the conductive layer while leaving other portions of the conductive layer overlying the glass bump exposed.

19. The method of claim 16, wherein the step of forming the conductive layer includes the steps of:
forming a conductive stress relief layer; and
forming a solder compatible layer overlying at least a portion of the conductive stress relief layer.

20. The method of claim 16, wherein the step of forming a wettable region includes providing a region of semiconductor material.

* * * * *